(12) United States Patent
Clemens et al.

(10) Patent No.: US 7,483,275 B2
(45) Date of Patent: Jan. 27, 2009

(54) ELECTRONIC UNIT, CIRCUIT DESIGN FOR THE SAME, AND PRODUCTION METHOD

(75) Inventors: Wolfgang Clemens, Puschendorf (DE); Walter Fix, Nürnberg (DE); Jörg Zapf, München (DE)

(73) Assignee: PolyIC GmbH & Co. KG, Furth (DE)

( * ) Notice: Subject to any disclaimer, the term of this patent is extended or adjusted under 35 U.S.C. 154(b) by 387 days.

(21) Appl. No.: 10/492,923

(22) PCT Filed: Sep. 6, 2002

(86) PCT No.: PCT/DE02/03296

§ 371 (c)(1),
(2), (4) Date: Apr. 14, 2004

(87) PCT Pub. No.: WO03/038897

PCT Pub. Date: May 8, 2003

(65) Prior Publication Data

US 2004/0256467 A1    Dec. 23, 2004

(30) Foreign Application Priority Data

Oct. 18, 2001    (DE) ................................ 101 51 440

(51) Int. Cl.
*H05K 7/02* (2006.01)
*H05K 7/06* (2006.01)
*H05K 7/08* (2006.01)
*H05K 7/10* (2006.01)

(52) U.S. Cl. .................. 361/760; 361/737; 361/766

(58) Field of Classification Search ......... 361/736–737, 361/760–766; 257/40, 213, 288, 528
See application file for complete search history.

(56) References Cited

U.S. PATENT DOCUMENTS 3,512,052 A    5/1970    MacIver et al.

(Continued)

FOREIGN PATENT DOCUMENTS

DE    33 38 597    5/1985

(Continued)

OTHER PUBLICATIONS

International Search Report dated May 30, 2003.

(Continued)

*Primary Examiner*—Tuan T Dinh
(74) *Attorney, Agent, or Firm*—Carella, Byrne et al.; Elliot M. Olstein; William Squire

(57) ABSTRACT

A method for the production of an encapsulated and at least partly organic electronic device wherein the device comprises a combination of three groups of different electronic units or components which may be separate discrete structures arranged to be produced independently from one another electrically conductively interconnected, the groups including inorganic units, passive units and active units or active components such as antennas, diodes (rectifier diodes and/or light-emitting diodes), some of which units may be organic, e.g., organic transistors, and so on, and forming a resulting optimized circuit. The components of the three groups of units forming the resulting circuit are combined on a one piece flexible substrate film which can also serve as an encapsulation layer for the device.

9 Claims, 5 Drawing Sheets

U.S. PATENT DOCUMENTS

Figure 1:
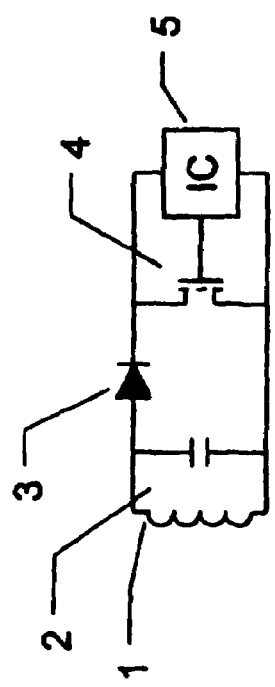

| | | | |
|---|---|---|---|
| 3,769,096 A | 10/1973 | Ashkin | |
| 3,955,098 A | 5/1976 | Kawamoto | |
| 4,302,648 A | 11/1981 | Sado et al. | |
| 4,340,657 A | 7/1982 | Rowe | |
| 4,442,019 A | 4/1984 | Marks | |
| 4,865,197 A | 9/1989 | Craig | |
| 4,926,052 A | 5/1990 | Hatayama et al. | |
| 4,937,119 A | 6/1990 | Nickles et al. | |
| 5,159,296 A | 10/1992 | Nelson | |
| 5,170,139 A | 12/1992 | Nelson | |
| 5,173,835 A | 12/1992 | Cornett et al. | |
| 5,206,525 A | 4/1993 | Yamamoto et al. | |
| 5,259,926 A | 11/1993 | Kuwabara et al. | |
| 5,321,240 A | 6/1994 | Takahira | 235/380 |
| 5,347,144 A | 9/1994 | Garnier et al. | |
| 5,364,735 A | 11/1994 | Akamatsu et al. | |
| 5,395,504 A | 3/1995 | Hoffman et al. | |
| 5,480,839 A | 1/1996 | Ezawa et al. | |
| 5,486,851 A | 1/1996 | Gehner et al. | |
| 5,502,396 A | 3/1996 | Desarzens | |
| 5,546,889 A | 8/1996 | Wakita et al. | |
| 5,569,879 A | 10/1996 | Gloton et al. | |
| 5,574,291 A | 11/1996 | Dodabalapur et al. | |
| 5,578,513 A | 11/1996 | Maegawa | |
| 5,580,794 A * | 12/1996 | Allen | 436/169 |
| 5,625,199 A | 4/1997 | Baumbach et al. | |
| 5,630,986 A | 5/1997 | Miller | |
| 5,652,645 A | 7/1997 | Jain | |
| 5,691,089 A | 11/1997 | Smayling | |
| 5,705,826 A | 1/1998 | Aratani et al. | |
| 5,729,428 A | 3/1998 | Sakata et al. | |
| 5,854,139 A | 12/1998 | Kondo et al. | |
| 5,869,972 A | 2/1999 | Birch et al. | |
| 5,883,397 A | 3/1999 | Isoda et al. | |
| 5,892,244 A | 4/1999 | Tanaka et al. | |
| 5,903,239 A * | 5/1999 | Takahashi et al. | 343/700 MS |
| 5,967,048 A | 10/1999 | Fromson et al. | |
| 5,970,318 A | 10/1999 | Choi et al. | |
| 5,973,598 A | 10/1999 | Beigel | 340/572.1 |
| 5,994,773 A | 11/1999 | Hirakawa | |
| 5,997,817 A | 12/1999 | Crismore et al. | |
| 5,998,805 A | 12/1999 | Shi et al. | |
| 6,036,919 A | 3/2000 | Thym et al. | |
| 6,045,977 A | 4/2000 | Chandross et al. | |
| 6,072,716 A | 6/2000 | Jacobsen et al. | |
| 6,083,104 A | 7/2000 | Choi | |
| 6,087,196 A | 7/2000 | Sturm et al. | |
| 6,133,835 A * | 10/2000 | De Leeuw et al. | 340/572.5 |
| 6,150,668 A | 11/2000 | Bao et al. | |
| 6,197,663 B1 | 3/2001 | Chandross et al. | |
| 6,207,472 B1 | 3/2001 | Calligari et al. | |
| 6,215,130 B1 | 4/2001 | Dodabalapur | |
| 6,221,553 B1 | 4/2001 | Wolk et al. | |
| 6,251,513 B1 | 6/2001 | Rector et al. | |
| 6,284,562 B1 | 9/2001 | Batlogg et al. | |
| 6,300,141 B1 | 10/2001 | Segal et al. | |
| 6,321,571 B1 | 11/2001 | Themont et al. | |
| 6,322,736 B1 | 11/2001 | Bao et al. | |
| 6,329,226 B1 | 12/2001 | Jones et al. | |
| 6,330,464 B1 | 12/2001 | Colvin et al. | |
| 6,335,539 B1 | 1/2002 | Dimitrakopoulos et al. | |
| 6,340,822 B1 | 1/2002 | Brown et al. | |
| 6,344,662 B1 | 2/2002 | Dimitrakopoulos et al. | |
| 6,362,509 B1 | 3/2002 | Hart | |
| 6,384,804 B1 | 5/2002 | Dodabalapur et al. | |
| 6,403,396 B1 | 6/2002 | Gudesen et al. | |
| 6,429,450 B1 | 8/2002 | DeLeeuw et al. | |
| 6,461,885 B1 | 10/2002 | Lupo et al. | |
| 6,466,131 B1 * | 10/2002 | Tuttle et al. | 340/572.7 |
| 6,498,114 B1 | 12/2002 | Amundson et al. | |
| 6,501,466 B1 | 12/2002 | Yamagishi | |
| 6,517,995 B1 | 2/2003 | Jacobsen et al. | |
| 6,555,840 B1 | 4/2003 | Hudson et al. | |
| 6,593,690 B1 | 7/2003 | McCormick et al. | |
| 6,603,139 B1 | 8/2003 | Tessler et al. | |
| 6,621,098 B1 | 9/2003 | Jackson et al. | |
| 6,815,240 B2 | 11/2004 | Hayashi | |
| 6,821,803 B2 | 11/2004 | Hayashi | |
| 6,852,583 B2 | 2/2005 | Bernds et al. | |
| 6,943,369 B2 | 9/2005 | Hayashi | |
| 2002/0018911 A1 | 2/2002 | Bernius et al. | |
| 2002/0022284 A1 | 2/2002 | Heeger et al. | |
| 2002/0025391 A1 | 2/2002 | Angelopoulos et al. | |
| 2002/0053320 A1 | 5/2002 | Duthaler | |
| 2002/0056839 A1 | 5/2002 | Joo et al. | |
| 2002/0068392 A1 | 6/2002 | Lee et al. | |
| 2002/0130042 A1 | 9/2002 | Stiene | |
| 2002/0170897 A1 | 11/2002 | Hall | |
| 2002/0195644 A1 | 12/2002 | Dodabalapur et al. | |
| 2003/0013220 A1 | 1/2003 | Lupo | |
| 2003/0059987 A1 | 3/2003 | Sirringhaus Henning et al. | |
| 2003/0112576 A1 | 6/2003 | Brewer et al. | |
| 2003/0175427 A1 | 9/2003 | Loo et al. | |
| 2004/0002176 A1 | 1/2004 | Xu | |
| 2004/0013982 A1 | 1/2004 | Jacobson et al. | |
| 2004/0026689 A1 | 2/2004 | Bernds et al. | |
| 2004/0084670 A1 | 5/2004 | Tripsas et al. | |
| 2004/0211329 A1 | 10/2004 | Funahata et al. | |
| 2005/0168340 A1 * | 8/2005 | Mosher et al. | 340/572.8 |

FOREIGN PATENT DOCUMENTS

| | | | |
|---|---|---|---|
| DE | 4243832 | | 6/1994 |
| DE | 198 52312 | | 5/1999 |
| DE | 198 16 860 | | 11/1999 |
| DE | 19918193 | | 11/1999 |
| DE | 198 51703 | | 5/2000 |
| DE | 19851703 | | 5/2000 |
| DE | 100 06257 | | 9/2000 |
| DE | 199 21024 | | 11/2000 |
| DE | 19933757 | | 1/2001 |
| DE | 69519782 | | 1/2001 |
| DE | 199 35 527 | | 2/2001 |
| DE | 199 37 262 | | 3/2001 |
| DE | 100 12204 | | 9/2001 |
| DE | 10033112 | | 1/2002 |
| DE | 100 45 192 | | 4/2002 |
| DE | 100 47 171 | | 4/2002 |
| DE | 100 43204 | | 4/2002 |
| DE | 100 58 559 | | 5/2002 |
| DE | 10061297 | | 6/2002 |
| DE | 101 17 663 | | 10/2002 |
| DE | 101 20 687 | | 10/2002 |
| DE | 102 19905 | | 12/2003 |
| EP | 0 108650 | | 5/1984 |
| EP | 0 128 529 | | 12/1984 |
| EP | 0 268 370 | A2 | 5/1988 |
| EP | 0 268 370 | A3 | 5/1988 |
| EP | 0 350 179 | | 1/1990 |
| EP | 0 418504 | | 3/1991 |
| EP | 0 442123 | | 8/1991 |
| EP | 0460242 | | 12/1991 |
| EP | 0501456 | A2 | 9/1992 |
| EP | 0501456 | A3 | 9/1992 |
| EP | 0 511807 | | 11/1992 |
| EP | 0 528662 | | 2/1993 |
| EP | 0685985 | | 12/1995 |
| EP | 0716458 | | 6/1996 |
| EP | 0 785 578 | A2 | 7/1997 |
| EP | 0 785 578 | A3 | 7/1997 |
| EP | 0 786820 | | 7/1997 |
| EP | 0 615 256 | B1 | 9/1998 |
| EP | 0962984 | | 12/1999 |
| EP | 0966182 | | 12/1999 |

| | | |
|---|---|---|
| EP | 0 979715 | 2/2000 |
| EP | 0981165 | 2/2000 |
| EP | 0989614 A2 | 3/2000 |
| EP | 1 048 912 | 11/2000 |
| EP | 1 052 594 | 11/2000 |
| EP | 1065725 A2 | 1/2001 |
| EP | 1065725 A3 | 1/2001 |
| EP | 1 083 775 A1 | 3/2001 |
| EP | 1 102 335 A2 | 5/2001 |
| EP | 1 104 035 A2 | 5/2001 |
| EP | 1 103916 | 5/2001 |
| EP | 1 134 694 | 9/2001 |
| EP | 1134694 A * | 9/2001 |
| EP | 1224999 | 7/2002 |
| EP | 1237207 | 9/2002 |
| EP | 1 318 084 | 6/2003 |
| FR | 2793089 | 11/2000 |
| GB | 723598 | 2/1955 |
| GB | 2 058 462 | 4/1981 |
| JP | 54069392 | 6/1979 |
| JP | 61167854 | 7/1986 |
| JP | 362065477 A | 3/1987 |
| JP | 05152560 | 6/1993 |
| JP | 05259434 | 10/1993 |
| JP | 05347422 | 12/1993 |
| JP | 06-196724 | 7/1994 |
| JP | 08197788 | 8/1996 |
| JP | 09083040 | 3/1997 |
| JP | 09320760 | 12/1997 |
| JP | 10026934 | 1/1998 |
| JP | 11-040708 | 2/1999 |
| JP | 2969184 B | 11/1999 |
| JP | 2000-029403 | 1/2000 |
| JP | 2000-173770 | 6/2000 |
| JP | 2001085272 | 3/2001 |
| JP | 2001-147659 | 5/2001 |
| JP | 2001-267578 | 9/2001 |
| WO | WO 93 16491 | 8/1993 |
| WO | WO 94/17556 | 8/1994 |
| WO | WO 95/06240 | 3/1995 |
| WO | WO 95 31831 | 11/1995 |
| WO | WO 96 02924 | 2/1996 |
| WO | WO 96/19792 | 6/1996 |
| WO | WO 97/12349 | 4/1997 |
| WO | WO 97/18944 | 5/1997 |
| WO | WO 98 18186 | 4/1998 |
| WO | WO 98/40930 | 9/1998 |
| WO | WO98/40930 | 9/1998 |
| WO | WO 99/07189 | 2/1999 |
| WO | WO 99/10929 | 3/1999 |
| WO | WO 99 10939 | 3/1999 |
| WO | WO 99 21233 | 4/1999 |
| WO | WO 99 30432 | 6/1999 |
| WO | WO99/30432 | 6/1999 |
| WO | WO 99 39373 | 8/1999 |
| WO | WO 99 40631 | 8/1999 |
| WO | WO 99/53371 | 10/1999 |
| WO | WO 99 54936 | 10/1999 |
| WO | WO 9954936 | 10/1999 |
| WO | WO 99/66540 | 12/1999 |
| WO | WO 00/33063 | 6/2000 |
| WO | WO 00/36666 | 6/2000 |
| WO | WO 01/03126 | 1/2001 |
| WO | WO 01/06442 | 1/2001 |
| WO | WO 0108241 | 2/2001 |
| WO | WO 01/15233 | 3/2001 |
| WO | WO 01 15233 | 3/2001 |
| WO | WO 01/17029 | 3/2001 |
| WO | WO 01 17041 | 3/2001 |
| WO | WO 01/27998 | 4/2001 |
| WO | WO 01/46987 | 6/2001 |
| WO | WO 01/47044 | 6/2001 |
| WO | WO 01 47045 | 6/2001 |
| WO | WO 0147044 A2 | 6/2001 |
| WO | WO 0147044 A3 | 6/2001 |
| WO | WO 0173109 A2 | 10/2001 |
| WO | WO 0173109 A3 | 10/2001 |
| WO | WO 02/05360 | 1/2002 |
| WO | WO 0205361 | 1/2002 |
| WO | WO 02/15264 | 2/2002 |
| WO | WO 02 19443 | 3/2002 |
| WO | WO 02/29912 | 4/2002 |
| WO | WO 02/43071 | 5/2002 |
| WO | WO 02/47183 | 6/2002 |
| WO | WO 0247183 | 6/2002 |
| WO | WO 02/065557 | 8/2002 |
| WO | WO 02/071139 | 9/2002 |
| WO | WO 02/071505 | 9/2002 |
| WO | WO 02/076924 | 10/2002 |
| WO | WO 02/091495 | 11/2002 |
| WO | WO 02/095805 | 11/2002 |
| WO | WO 02095805 A2 | 11/2002 |
| WO | WO 02095805 A3 | 11/2002 |
| WO | WO 02/099908 | 12/2002 |
| WO | WO 02099907 | 12/2002 |
| WO | WO 03/046922 | 6/2003 |
| WO | WO 03/069552 | 8/2003 |
| WO | WO 03067680 | 8/2003 |
| WO | WO 03/081671 | 10/2003 |
| WO | WO 03/095175 | 11/2003 |
| WO | WO 2004/032257 | 4/2004 |
| WO | WO 2004/042837 | 5/2004 |
| WO | WO 2004042837 | 5/2004 |
| WO | WO 2004007194 A2 | 6/2004 |
| WO | WO 2004007194 A3 | 6/2004 |
| WO | WO 2004047144 A2 | 6/2004 |
| WO | WO 2004047144 A3 | 6/2004 |
| WO | WO 2004/083859 | 9/2004 |
| WO | WO 00 79617 | 12/2004 |

OTHER PUBLICATIONS

Garnier F et al:, "Vertical Devices Architecture By Molding Of Organic-Based Thin Film Transistor", Applied Physics Letters, American Institute Of Physics. XP000784120, Issn: 0003-6951 abbildung 2.

Collet J. et al:, Low Voltage, 30 NM Channel Length, Organic Transistors With a Self-Assembled Monolayer As Gate Insulating Films:, Applied Physics Letters, American Institute of Physics. New York, US, Bd 76, Nr. 14, Apr. 3, 2000, Seiten 1941-1943, XP000950589, ISSN:0003-6951, das ganze Dokument.

Hwang J D et al:, "A Vertical Submicron Sic thin film transistor", Solid State Electronics, Elsevier Science Publishers, Barking, GB, Bd. 38, Nr. 2, Feb. 1, 1995, Seiten 275-278, XP004014040, ISSN:0038-1101, Abbildung 2.

Rogers J A et al:, "Low-Voltage 0.1 Mum Organic Transistors and Complementary Inverter Circuits Fabricated with a Low-Cost Form of Near-Field Photolithography", Applied Physics Letters, American Institute of Physics. New York, US, Bd. 75, Nr. 7, Aug. 16, 1999, Seiten 1010-1012, XP000934355, ISSN: 003-6951, das ganze Dokument.

"Short-Channel Field-Effect Transistor", IBM Technical Disclosure Bulletin, IBM Corp., New York, US, Bd. 32, Nr. 3A, Aug. 1, 1989, Seiten 77-78, XP000049357, ISSN:0018-8689, das ganze Dokument.

Redecker, M. et al., "Mobility enhancement through homogeneous nematic alignment of a liquid-crystalline polyfluorene", 1999 American Institute of Physics, Applied Physics Letters, vol. 74, No. 10, pp. 1400-1402.

Rogers, J. A. et al., "Printing Process Suitable for Reel-to-Reel Production of High-Performance Organic Transistors and Circuits", Advanced Materials, VCH, Vertagsgesellschaft, Weinheim, DE, Bd. 11, Nr. 9, Jul. 5, 1999, Seiten 741-745, P000851834, ISSN: 0935-9648, das ganze Dokument.

Miyamoto, Shoichi et al:, Effect of LDD Structure and Channel Poly-Si Thinning on a Gate-All-Around TFT (GAT) for SRAM's, IEEE Transactions on Electron Devices, vol. 46, No. 8, Aug. 1999.

Kumar, Anish et al:, "Kink-Free Polycrystalline Silicon Double-Gate Elevated-Channel Thin-Film Transistors", IEEE Transactions on Electron Devices, vol. 45, No. 12, Dec. 1998.

Chen, Shiao-Shien et al:, "Deep Submicrometer Double-Gate Fully-Depleted SOI PMOS Devices: A Concise Short-Channel Effect Threshold Voltage Model Using a Quasi-2D Approadh", IEEE Transaction on Electron Devices, Vol. 43, No. 9, Sep. 1996.

Zangara L: "Metall Statt Halbleiter, Programmierung Von Embedded ROMS Ueber Die Metallisierungen", Elektronik, Franzis Verlag GMBH, Munchen, DE, Bd. 47, Nr. 16, Aug. 4, 1998, Seiten 52-55, XP000847917, ISSN: 0013-5658, Seite 52, rechtes Plate, Zeile 7-Seite 53, linke Spalte, Zeile 14; Abbildungen 1, 2.

Hergel, H. J.: "Pld-Programmiertechnologien", Elektronik, Franzis Verlag GMBH. Munche, DE, Bd 41, Nr. 5, Mar. 3, 1992, Seiten 44-46, XP000293121, ISSN: 0013-5658, Abbildungen 1-3.

Forrest et al.: "The Dawn of Organic Electronics", IEEE Spectrum, Aug. 2000, Seiten 29-34, XP002189000, IEEE Inc., New York, US ISSN:0018-9235, Seite 33, rechte Spalte, Zelle 58-Seite 34, linke Spalte, Zeile 24; Abbildung 5.

Patent Abstracts of Japan, vol. 009, No. 274 (E-354), Oct. 31, 1985 & JP 60 117769 A (Fujitsu KK), Jun. 25, 1985 Zusammenfassung.

Zie Voor Titel Boek, de 2e Pagina, XP-002189001, p. 196-228.

Drury et al., "Low-Cost All-Polymer Integrated Circuits", American Institute of Physics, Applied Physics Letters, 1998, vol. 73, No. 1, pp. 108-110, Jul. 6, 1998.

Kuhlmann et al., "Terabytes in Plastikfolie", Organische Massenspeicher vor der Serienproduktion.

Garnier, F. et al, "All-Polymer Field-Effect Transistor Realized by Printing Techniques", Science, American Association for the Advancement of Science, US, vol. 265, Sep. 16, 1994, pp. 1684-1686.

Assadi A, et al:, Field-Effect Mobility of Poly (3-Hexylthiophene) Dept. of Physics and Measurement Technology, Received Mar. 3, 1988; accepted for Publication May 17, 1988.

Bao, Z. et al., "High-Performance Plastic Transistors Fabricated by Printing Techniques", Chem. Mater vol. 9, No. 6, 1997, pp. 1299-1301.

Drury, C. J. et al., "Low-cost all-polymer integrated circuits", Applied Physics Letters, vol. 73, No. 1, Jul. 6, 1988, pp. 108-110.

Angelopoulos M et al, "In-Situ Radiation Induced Doping", Mol. Cryst. Liq. Cryst. 1990, vol. 189, pp. 221-225.

Dai, L. et al, Photochemical Generation of Conducting Pattersn in Polybutadiene Films:, Macromolecules, vol. 29, No. 1, 1996, pp. 282-287, XP 001042019, the whole document.

Roman et al., Polymer Diodes With High Rectification:, Applied Physics Letters, vol. 75, No. 21, Nov. 22, 1999.

Patent Abstracts of Japan, vol. 010, No. 137, May 21, 1986 (JP 361001060A).

Schoebel, "Frequency Conversion with Organic-On-Inorganic Heterostructured Diodes", Extended Abstracts of the International Conference on Solid State Devices and Materials, Sep. 1, 1997.

Braun D., et al, "Visible light emission from semiconducting polymer diodes", American Institute of Physics, Applied Physics Letters 58, May 6, 1991, pp. 1982-1984.

Yu, G. et al., "Dual-function semiconducting polymer devices: Light-emitting and photodetecting diodes", American Institute of Physics, Applied Physics Letter 64, Mar. 21, 1994, pp. 1540-1542.

Lucent Technologies, "Innovation marks significant milestone in the development of electronic paper", Cambridge, MA and Murray Hill, NJ, Nov. 20, 2000. XP-002209726.

Hebner, T.R. et al., Ink-jet printing of doped polymers for organic light emitting devices:, American Institute of Physics, Applied Physics Letters, vol. 72, No. 5, Feb. 2, 1998, pp. 519-521.

Garnier et al., "Conjugated Polymers and Oligomers as Active Material For Electronic Devices", Synthetic Metals, vol. 28, 1989.

Gelinck, G.H. et al., "High-Performance All-Polymer Integrated Circuits", Applied Physics Letters, v. 77, 2000, pp. 1487-1489.

Zheng, Xiang-Yang et al., "Electrochemical Patterning of the Surface of Insulators with Electrically Conductive Polymers", J. Electrochem. Soc., v. 142, 1995, pp. L226-L227.

Lidzey, D. G. et al., "Photoprocessed and Micropatterned Conjugated Polymer LEDs", Synthetic Metals, v. 82, 1996, pp. 141-148.

Kobel W. et al., "Generation of Micropatterns In Poly, (3-Methyl-Thiophene) Films Using Microlithography: A First Step in the Design of an All-Organic Thin-Film Transistor" Synthetic Metals, v. 22, 1988, pp. 265-271.

Rost, Henning et al., "All-Polymer Organic Field Effect Transistors", Proc. Mat. Week, CD, 2001, pp. 1-6.

Manuelli, Alessandro et al., "Applicability of Coating Techniques for the Production of Organic Field Effect Transistors", IEEE Polytronic 2002 Conference, 2002, pp. 201-204.

Ullman, A. et al., "High Performance Organic Field-Effect Transistors and Integrated Inverters", Mat. Res. Soc. Symp. Proc., v. 665, 2001, pp. 265-270.

Fix, W. et al., "Fast Polymer Integrated Circuits Based on a Polyfluorene Derivative", ESSDERC 2002, 2002, pp. 527-529.

Knobloch, A. et al., "Printed Polymer Transistors", Proc. Polytronic, v. 84, 2001, pp. 84-89.

Ficker, J. et al., "Dynamic and Lifetime Measurements of Polymer OFETS and Integrated Plastics Circuits," Proc. of SPIE, v. 466, 2001, pp. 95-102.

Clemens, W. et al., "Vom Organischen Transistor Zum Plastik-Chip," Physik Journal, v. 2, 2003, pp. 31-36.

Crone, B. et al., "Large-scale complementary Integrated circuits based on Organic transistors", Nature, vol. 403, Feb. 3, 2000, pp. 521.

Fix, W., et al., "Fast polymer integrated circuits", American Institute of Physics, Applied Physics Letters, vol. 81, No. 89, Aug. 2002, pp. 1735-1737.

Dodabalapur, A. et al., Organic smart pixels, American Institute of Physics, Applied Physics Letters, vol. 73, No. 2, Jul. 13, 1998, pp. 142-144.

Halls, J.J. M., et al., "Efficient photodiodes from interpenetrating polymer networks", Nature, vol. 376, Aug. 10, 1995, pp. 498-500.

Brown, A.R. et al., "Field-effect translators made from solution-processed organic semiconductors", Elsevier Science, S.A., Synthetic Metals 88 (1997) pp. 37-55.

Brown, A.R., "Logic Gates Made from Polymer Transistors and Their Use in Ring Oscillators", Science, vol. 270, Nov. 10, 1995, pp. 972-974.

Klauk, H. et al., "Pentacene Thin Film Transistors and Inverter Circuits", 1997 International Exectron Devices Meeting Technical Digest, pp. 539-542, Dec. 1997.

Klauk, H. et al., "Fast Organic Thin Film Transistor Circuits", IEEE Electron Device Letters, vol. 20, No. 6, pp. 289-291.

Bao, Z. et al., "Organic and Polymeric Materials for the Fabrications of Thin Film Field-Effect Transistors", paper presented at the meeting of American Chemical Society, Division of Polymer Chemistry, XX, XX, Bd. 39, Nr. 1, Mar. 29, 1998, P001032497, ISSN: 0032-3934 das ganze Dokument.

Patent Abstracts of Japan, vol. 013, No. 444 (E-828), Oct. 5, 1989 & JP 01 169942 A (Hitachi Ltd), Jul. 5, 1989.

Schrodner M. et al., "Plastic electronics based on Semiconducting Polymers", First International IEEE Conference on Polymers and Adhesives in Microelectronics and Photonics. Incorporating Poly, Pep & Adhesives in Electronics. Proceedings (Cat. No. 01TH8592), First International IEEE Conference on Polymers and Adhesives in Micr, Seitenn 91-94.

Oelkrug, D. et al., "Electronic spectra of self-organized oligothiophene films with 'standing' and 'lying' molecular units", Elsevier Science S.A. 1996, Thin Solid Films 264-270.

Sandberg, H. et al, "Ultra-thin Organic Films for Field Effect Transistors", SPIE vol. 4466, 2001, pp. 35-43.

Chen, X.L. et al., "Morphological and Transistor Studies of Organic Molecular Semiconductors with Anisotropic Electrical Characteristics", American Chemical Society, 2001, Chem. Mater. 2001, 13, 1341-1348.

De Leeuw D.M. et al., "Polymeric integrated circuits and light-emitting diodes", Electron Devices Meeting, 1997. Technical Digest, International, Washington, DC, USA Dec. 7-10, 1997, New York, NY, USA, IEEE, US Dec. 7, 1997.

Lowe, J. et al., "Poly (3—(2—Acetoxyethyl)Thiophene): A Model Polymer for Acid-Catalyzed Lithography", Synthetic Metals, Elsevier Sequoia, Lausanne, CH, Bd. 85, 1997, Seiten 1427-1430.

Fraunhofer Magazin- Polytronic Chips Von der Rolle, Apr. 2001, pp. 8-13.

Harsanyi G. et al., "Polytronics for biogtronics:unique possibilities of polymers in biosensors and BioMEMS", IEEE Polytronic 2002 Conference, Jun. 23, 2002, pp. 211-215.

U.S. Appl. No. 10/344,951, Adolf Bernds et al.
U.S. Appl. No. 10/362,932, filed Oct. 2, 2003, Adolf Bernds et al.
U.S. Appl. No. 10/380,113, filed Sep. 25, 2003, Adolf Bernds et al.
U.S. Appl. No. 10/380,206, Adolf Bernds et al.
U.S. Appl. No. 10/381,032, Adolf Bernds et al.
U.S. Appl. No. 10/433,959, Adolf Bernds.
U.S. Appl. No. 10/433,961, Wolfgang Clemens et al.
U.S. Appl. No. 10/451,108, Mark Giles et al.
U.S. Appl. No. 10/467,636, Adolf Bernds et al.
U.S. Appl. No. 10/473,050, Adolf Bernds et al.
U.S. Appl. No. 10/479,234, filed Dec. 30, 2004, Adolf Bernds et al.
U.S. Appl. No. 10/479,238, Adolf Bernds et al.
U.S. Appl. No. 10/492,922, Erwann Buillet et al.
U.S. Appl. No. 10/492,923, filed Dec. 23, 2004, Wolfgang Clemens et al.
U.S. Appl. No. 10/498,610, Walter Fix et al.
U.S. Appl. No. 10/508,640, Walter Fix et al.
U.S. Appl. No. 10/508,737, Adolf Bernds et al.
U.S. Appl. No. 10/517,750, Wolfgang Clemens et al.
U.S. Appl. No. 10/523,216, Adolf Bernds et al.
U.S. Appl. No. 10/523,487, Wolfgang Clemens et al.
U.S. Appl. No. 10/524,646, Walter Fix et al.
U.S. Appl. No. 10/533,756, Wolfgang Clemens et al.
U.S. Appl. No. 10/534,678, Wolfgang Clemens et al.

Brabec, C.J. et al, "Photoinduced FT-IR spectroscopy and CW-photocurrent measurements of conjugated polymers and fullerenes blended into a conventional polymer matrix", Solar Energy Materials and Solar Cells, 2000 Elsevier Science V.V., pp. 19-33.

Brabec, C.J. et al., "Photovoltaic properties of a conjugated polymer/ methanofullerene composites embedded in a polystyrene matrix", Journal of Applied Physics, vol. 85, No. 9, 1999, pp. 6866-6872.

Gosain, D.P., "Excimer laser crystallized poly-Si TFT's on plastic substrates", Second International Symposium on Laser Precision Microfabrication, May 16-18, 2001, Singapore, vol. 4426, pp. 394-400.

Lu, Wen et al., "Use of Ionic Liquids for π-Conjugated Polymer Electrochemical Devices", Science, vol. 297, 2002, pp. 983-987.

Shaheen, S.E., et al., "Low band-gap polymeric photovoltaic devices", Synthetic Metals, vol. 121, 2001, pp. 1583-1584.

Takashima, W. et al., Electroplasticity Memory Devices Using Conducting Polymers and Solid Polymer Electrolytes, Polymer International, Melbourne, 1992, pp. 249-253.

Velu, G. et al. "Low Driving Voltages and Memory Effect in Organic Thin-Film Transistors With A Ferroelectric Gate Insulator", Applied Physics Letters, American Institute of Physics, New York, vol. 79, No. 5, 2001, pp. 659-661.

Wang, Hsing et al., "Conducting Polymer Blends: Polythiophene and Polypyrrole Blends with Polystyrene and Poly(bisphenol A carbonate)", Macromolecules, 1990, vol. 23, pp. 1053-1059.

Wang, Yading et al., "Electrically Conductive Semiinterpenetrating Polymer Networks of Poly(3-octylthiophene)", Macromolecules 1992, vol. 25, pp. 3284-3290.

U.S. Appl. No. 10/535,448, Wolfgang Clemens et al.
U.S. Appl. No. 10/535,449, Walter Fix et al.
U.S. Appl. No. 10/344,926, filed Feb. 12, 2004, Adolf Bernds et al.
U.S. Appl. No. 10/541,815, Axel Gerlt et al.
U.S. Appl. No. 10/541,956, Wolfgang Clemens et al.
U.S. Appl. No. 10/541,957, Walter Fix et al.
U.S. Appl. No. 10/543,561, Wolfgang Clemens et al.
U.S. Appl. No. 10/542,678, Adolf Bernds et al.
U.S. Appl. No. 10/542,679, Adolf Bernds et al.

Dai, L. et al., "Conjugation of Polydienes by Oxidants Other Than Iodine", Elsevier Science S.A., Synthetic Metals 86 (1997) 1893-1894.

Dai, L. et al., "$I_2$-Doping of 1,4-Polydienes", Elsevier Science S.A., Synthetic Metals 69 (1995), pp. 563-566.

Kawase, T. et al., "Inkjet Printed Via-Hole Interconnections and Resistors for All-Polymer Transistor Circuits", Advanced Materials 2001, 13, No. 21, Nov. 2, 2001, pp. 1601-1605.

Qiao, X. et al., "The FeCl3-doped poly3-alkithiophenes) in solid state", Elsevier Science, Synthetic Metals 122 (2001) pp. 449-454.

U.S. Appl. No. 10/332,140, Method for the Production and Configuration of Organic Field-Effect Transistors (OFET), Adolf Bernds et al.

U.S. Appl. No. 10/344,951, Organic Field-Effect Transistor (OFET), A Production Method Therefor, An Integrated Circuit Constructed From the Same and Their Uses.

U.S. Appl. No. 10/362,932, Organic Field Effect Transistor, Method for Structuring an OFET and Integrated Circuit, Adolf Bernds et al.

U.S. Appl. No. 10/380,113, Organic Rectifier, Circuit, RFID Tag and Use of an Organic Rectifier, Adolf Bernds et al.

U.S. Appl. No. 10/380,206, Organic Memory, Identification Marker (RFID-TAG) with Organic Memory and Uses of an Organic Memory, Adolf Bernds et al.

U.S. Appl. No. 10/381,032, Electrode and/or Conductor Track for Organic Components and Production Method Thereof, Adolf Bernds et al.

U.S. Appl. No. 10/433,959, Organic Field Effect Transistor, Method For Structuring and OFET and Integrated Circuit, Adolf Bernds.

U.S. Appl. No. 10/433,961, Device For Detecting and/or Transmitting at Least One Environmental Influence, Method for Producing Said Device and Use Thereof, Wolfgang Clemens et al.

U.S. Appl. No. 10/467,636, Organic Field Effect Transistor With a Photostructured Gate Dielectric, Method for the Production and Use Thereof in Organic Electronics, Adolf Bernds et al.

U.S. Appl. No. 10/473,050, Device With At Least Two Organic Electronic Components and Method for Producing the Same, Adolf Bernds et al.

U.S. Appl. No. 10/479,234, Organic Field Effect Transistor, Method for Production and Use Thereof in the Assembly of Integrated Circuits, Adolf Bernds et al.

U.S. Appl. No. 10/479,238, Method For Producing Conductive Structures by Means of Printing Technique, and Active Components Produced Therefrom For Integrated Circuits, Adolf Bernds et al.

U.S. Appl. No. 10/492,922, Insulator for An Organic Electronic Component, Erwann Guillet et al.

U.S. Appl. No. 10/492,923, Electronic Unit, Circuit Design for the Same and Production Method, Wolfgang Clemens et al.

U.S. Appl. No. 10/498,610, Organic Field Effect Transistor with Offset Threshold Voltage and the Use Thereof, Walter Fix et al.

Koezuka, H. et al., "Macromolecular Electronic Device", Mol. Cryst. Liq. Cryst. 1994, vol. 2555, pp. 221-230.

U.S. Appl. No. 10/562,989, filed Jun. 29, 2006, Jurgen Ficker et al.
U.S. Appl. No. 10/562,869, filed Oct. 5, 2006, Walter Fix et al.
U.S. Appl. No. 10/569,763, Walter Fix et al.
U.S. Appl. No. 10/568,730, filed Feb. 8, 2007, Wolfgang Clemens et al.
U.S. Appl. No. 10/569,233, filed Jan. 25, 2007, Adolf Bernds et al.
U.S. Appl. No. 10/570,571, filed Jan. 11, 2017, Wolfgang Clemens et al.
U.S. Appl. No. 10/585,775, Walter Fix.
U.S. Appl. No. 11/574,139, Jurgen Ficker.

* cited by examiner

ELECTRONIC UNIT, CIRCUIT DESIGN FOR THE SAME, AND PRODUCTION METHOD

The invention relates to a novel concept for the production of an encapsulated and at least partly organic electronic unit. Said unit embodies a novel concept for the combination of different electronic components to form an electronic unit, such as antennae, diodes (rectifier diodes and/or light-emitting diodes), transistors, etc. and a circuit, which is optimized for this purpose.

Electronic units such as, for example, radio frequency identification (RFID) tags, Sensor Arrays, photovoltaic cells and the like, which are based on conventional silicon technology, are more well-established.

Said electronic units are employed, for example, as electronic bar codes for consumer goods, as electronic watermarks, as electronic stamps, as bag tags and/or as tickets.

Such electronic units could be produced significantly cheaper, if they could be built, at least in part, from components, which are based on organic electronics (plastic electronics). However, this presents several problems. At first, various components groups such as antennae, rectifiers and/or transponder chips have to be produced in very different processes and then assembled and encapsulated.

Circuits for the new plastic electronic components, which are familiar from DE 100 43 204.2, for example, have been published thus far by Hart, C. M., De Leeuw, O. M. et al., Philips Res. Lab., ESSCIRC '98, ISBN 2-86332-235-4, 1998) (see FIG. 1 in this regard), wherein only modulation transistor 4 and integrated circuit 5 are based on organic materials. Antenna 1, capacitor 2 and the silicon diode 3 are made from inorganic materials (conventional silicon technology). One OFET (organic field-effect transistor) 4 is inserted after the rectifier diode 3. However, the problem with this embodiment is that modulation transistor 4 can only switch a small portion of the electric power, since otherwise the power supply for the integrated circuit 5 would collapse. Another problem is that rectifier diode 3 utilizes only half of the furnished electric power to supply the RFID tag, since one diode can only rectify one half-wave of the alternating current. The reason this is such a particularly serious disadvantage is that the furnished power for an RFID tag, for example, is limited by law, and reducing by half the furnished power substantially limits the working range and thus the range of application of the electronic units.

A typical electronic unit such as the RFID tag is comprised of several components such as, for example, antennae, capacitors, diodes (light-emitting diodes and/or rectifier diodes), possibly photovoltaic cells and at least an integrated circuit including transistors. Such individual components necessitate different production methods, since they require different materials and processing techniques. Producing transistors, for example, calls for particular high-resolution deposition structuring techniques, which requires working with materials that can be relatively easily managed, whereas producing organic-based diodes and/or capacitors requires handling of difficult materials, which in turn provides sufficient quality with far less costly structuring. Again, metal is generally used in the production of antennae, which requires completely different processing equipment and techniques. Producing at least partially organic (plastic) electronic units is relatively complicated and has currently not yet been the subject of publications. However, solutions should be found for the necessary marketability as a mass throw-away product, so that these many different production steps can be handled as efficiently as possible.

The invention is therefore required to provide at least in part organic electronic units and/or circuits, which through selection and configuration of the components allows for cost-effective production and encapsulation. The objective hereby is to optimize familiar circuits with respect to power transfer and (charge) modulation and to realize efficient mass production methods at the same time.

Following is the description of a solution on how this can be realized: a novel concept of combining components into one electronic unit, such as antennae, diodes (rectifier diodes and/or light-emitting diodes), transistors, etc., and/or suitable optimization of the circuit design.

The subject matter of the invention concerns an organic electronic device comprising at least three groups of components:

One group of essentially inorganic units (e. g. antennae);
One group of passive, preferably, organic units; and
One group of active, preferably, organic units;

wherein the group comprising passive units contains no active units or no active components, wherein the group of active units essentially contains organic field-effect transistors and usually no passive units, wherein the three groups can be produced independently from one another, wherein said units are interconnected by electrically conductive tracks and contacts on a flexible substrate and/or via a flexible encapsulation substrate layer forming a circuit on the substrate, through which circuit the electrically conductive tracks run between passive and active units from one group to another.

A group is considered one or several unit(s) integrated on one substrate (or region thereof) and/or under one encapsulation, which can be produced by procedural steps that can easily be combined in terms of process and that are based on comparable conditions.

Moreover, the subject matter of the invention concerns a circuit for an electronic unit that is at least partly based on organic functional polymers comprising the following components:

one antenna (1), one capacitor (2), one diode (3) and one modulation transistor (4) in front of an integrated circuit (5), wherein two capacitors (7, 8) and an additional diode (6) are switched in such a way as to supply the integrated circuit (5) via a capacitor (7), and wherein, at the same time, one diode (6) prevents said modulation transistor (4) from depriving said capacitor (7) with energy.

Lastly, the subject matter of the invention concerns a method to produce an organic electronic unit, based on at least one inorganic unit (antenna), comprising one passive, preferably, organic-based and one active, preferably, organic-based unit, said antenna, said passive and active units being pre-assembled separately, the circuit then being assembled through simple electric contacts of the individual components.

In this context, a complete transponder such as, for example, an RFID tag is considered an electronic unit, at any rate, a unit comprising several components, wherein said component represents the smaller unit, but can definitely consist of a multitude of components such as transistors, capacitors, photovoltaic cells, etc.

Diodes (rectifier and/or light-emitting diode), couplers such as an optocoupler, capacitors, resistors and/or the like are identified as "passive units." An "active unit," for example, refers to transistors, photovoltaic cells, sensors and/or the like. However, integrated active circuits could also be comprised of passive units such as resistors.

Within the framework of the invention passive and/or active units are preferably employed containing at least partly organic functional polymers (or electrically conductive or semiconducting organic materials, in general). For brevity's sake, such materials are identified as "organic units," although said units may well embody non-organic parts, but at least one organic part, preferably, one organic functional polymer is embodied in one unit, which is referred to here as "organic unit."

The circuit is particularly advantageous for the employment of RFID tags.

Antennae, for example, are utilized as units, which can be coils, for example, either made from metal or metallic compounds such as, for example, alloys, copper, aluminum and/or possibly also a metallic, organic functional polymer such as, for example, conductive silver and/or from organic material only, such as, for example, polyaniline, Pedot, Russ, or compounds thereof.

Antennae, such as the other units and/or components of the organic electronic unit, are also arranged on a substrate and protected by an encapsulation, which may form the substrate at the same time, against unwelcome environmental stress.

A flexible film (such as, for example, polyester) can be used as a substrate, for example. If necessary, said film may have distinctly different barrier properties against moisture and air, since the units are comprised in part of organic materials, which become unstable under the influence of moisture and/or oxygen. Said barrier properties may exist either through the film material itself, through additives in the film, through coating (such as, for example, silicates and/or metal-coating) and/or also through several of the aforementioned individual measures. The substrate film must be damage-resistant based on the conditions imposed by the production steps (temperature, mechanical forces, processing media . . . ).

Appropriate components, such as, for example, integrated circuits, consisting of organic transistors, passive units, organic diodes (light-emitting diodes as well as rectifier diodes), organic photovoltaic cells and similar components are arranged on the substrate and/or the encapsulation, preferably, flexible films. Moreover, a combination of organic and inorganic units is also possible (for example, mostly metallic antennae combined with an organic transponder chip circuits).

In order to insulate the films electrically, one insulation layer is deposited at least on the surface of the film (e.g. through methods such as screening, spray coating, crawling, laminating of an additional, possibly, pre-punched film . . . ).

All individual components were equipped with electrically conductive contacts. Two or more of these components were then interconnected by interconnecting said electrical contacts, preferably with electrically conductive glue or an electrically conductive adhesive.

By doing so, the required electrical hole contacts or strip tracks for the hole contacts (Vias) can be placed at the same time, or subsequently generated by opening the insulation layer, for example, by means of a laser. The vias can then be filled to make them conductible, for example, through screening of conductive glue or through currentless metal-coating. Under the simplest of circumstances, only a thin insulating layer is chosen so that filling of the vias can be abandoned.

The components were again encapsulated preferably with a film having a similar arrangement and similar characteristics as described for the substrate hereinabove. This can, for example, be carried out through gluing or welding. It is preferred that the encapsulation is deposited gas-tight. If the individual components were encapsulated before being assembled and contacted into a complete electronic unit, electrical connections can be lead through from this encapsulation, e.g., for power supply, signal transmission or for sensory purposes. Thus, an encapsulated unit with combined electronic components containing polymer is obtained. If the various components must be produced in different processes or, if it is economically more beneficial, the various components may also be deposited separately on the substrate film and/or on the encapsulation film and combine them as described in the assembly process hereinabove. Attention must be paid to the electrical insulation, on the one hand, and to a defined through-hole connection, on the other hand.

The production process of the respective component or the electronic unit is optimized in that the two films (substrate and encapsulation) are equally employed for the arrangement of components in order to require as few individual manufacturing steps for the complete production as possible.

Here, the term "organic material" or "organic functional polymer" comprises all sorts of organic, metallic-organic and/or organic/inorganic synthetic materials (hybrids), in particular those, which are referred to, for example, as "plastics" in the English language. It concerns all types of materials except semiconductors, which form classic diodes (germanium, silicon), and typical metallic conductors. Therefore, dogmatically speaking, there are no plans to limit the use to organic carbon-containing materials, rather, the wide use of, for example, silicon, is considered. Furthermore, the term should not be subject to any limitations with respect to molecular size, in particular, limitations to polymer and/or oligomer materials, rather, the use of "small molecules" is also quite possible. The word component "polymer" in functional polymer is historic and insofar contains no information about the existence of actual polymer compounds.

Said circuit is particularly advantageous for RFID tags that are based on organic material. As a result of the selection and configuration of the components on the units and the low number of different components, the circuit allows for cost-effective production and encapsulation.

The method for the production takes into consideration the fact that the individual components of an electronic unit, such as capacitor and transistor, for example, call for different manufacturing conditions and requirements. That way, all components of one "kind" are combined on one unit each, so that units can be produced in the shortest possible production line. The units are then encapsulated and linked with one another on the substrate, either individually or combined. In doing so, a unit embodying organic-based components can still be assembled with conventional, that is, silicon-containing components.

In the following, the invention is described in detail based on individual figures, which depict embodiments of the invention when compared to prior art:

FIG. 1 depicts prior art familiar from publications by Hart, C. M., Leeuw, D. M. et al., Philips Res. Lab., ESSCIRC '98, ISBN 2-86332-235-4, 1998.

Figure 2:
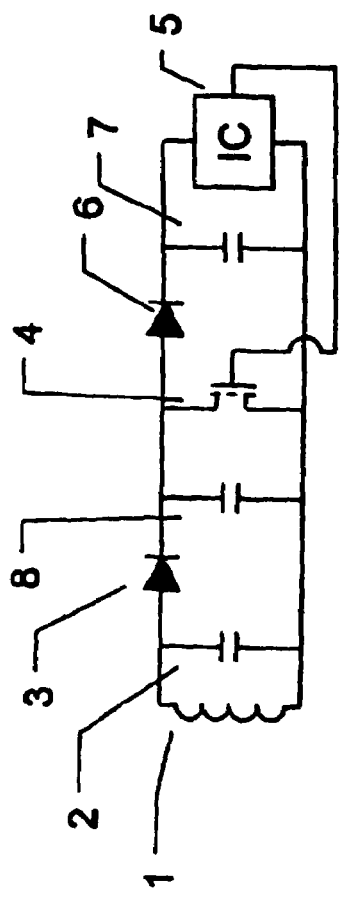
Figure 3:
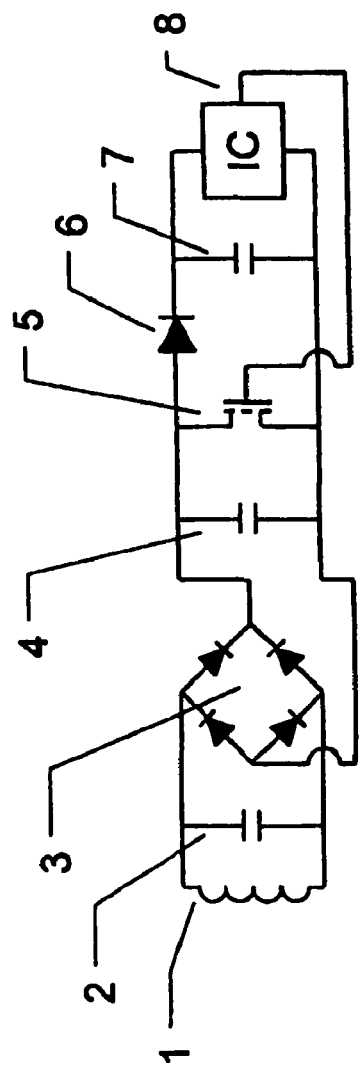
Figure 4:
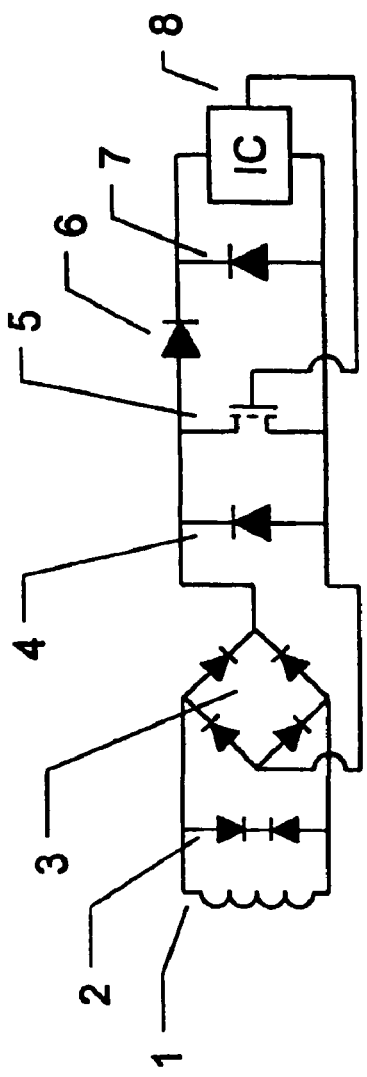
Figure 5:
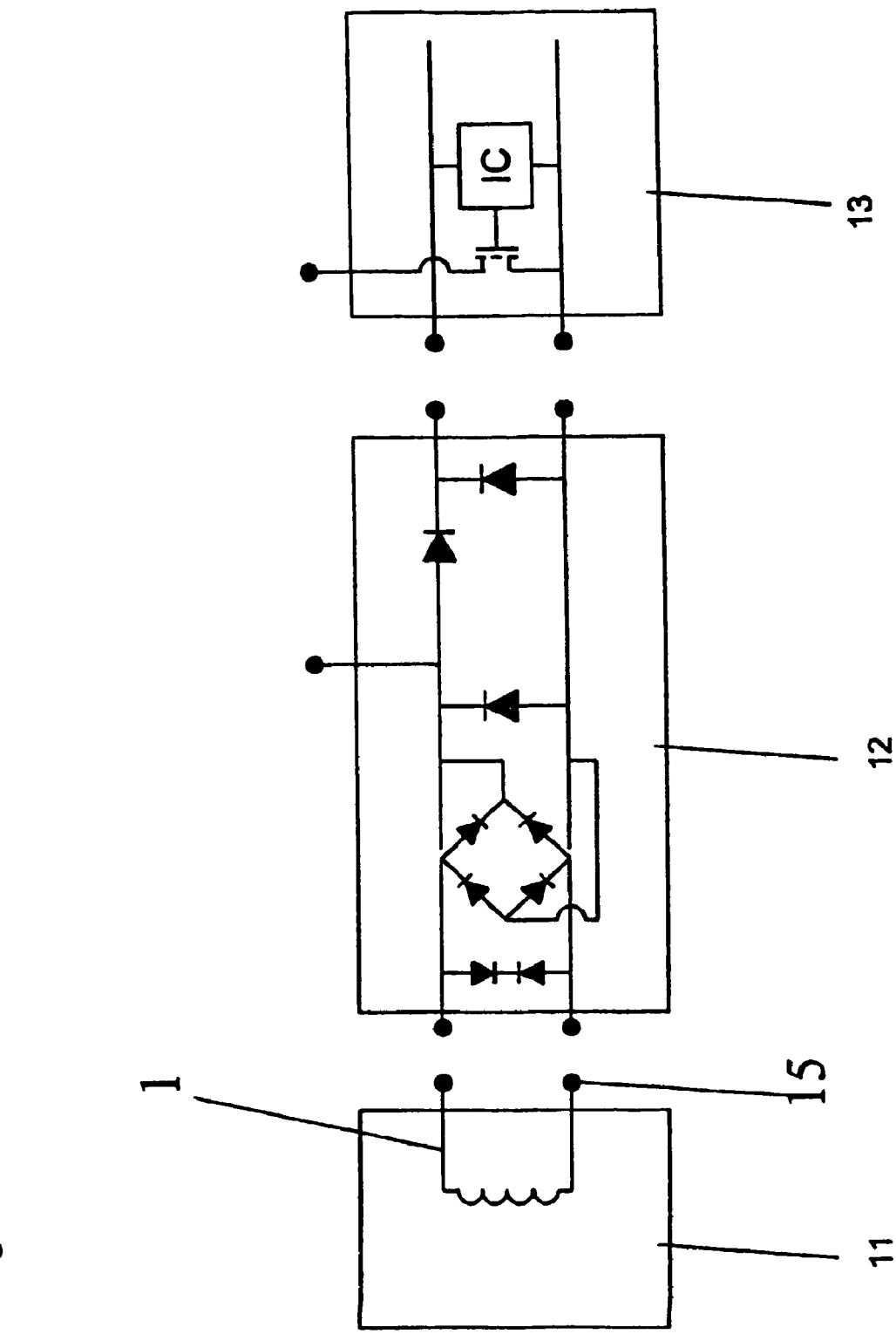
Figure 6:
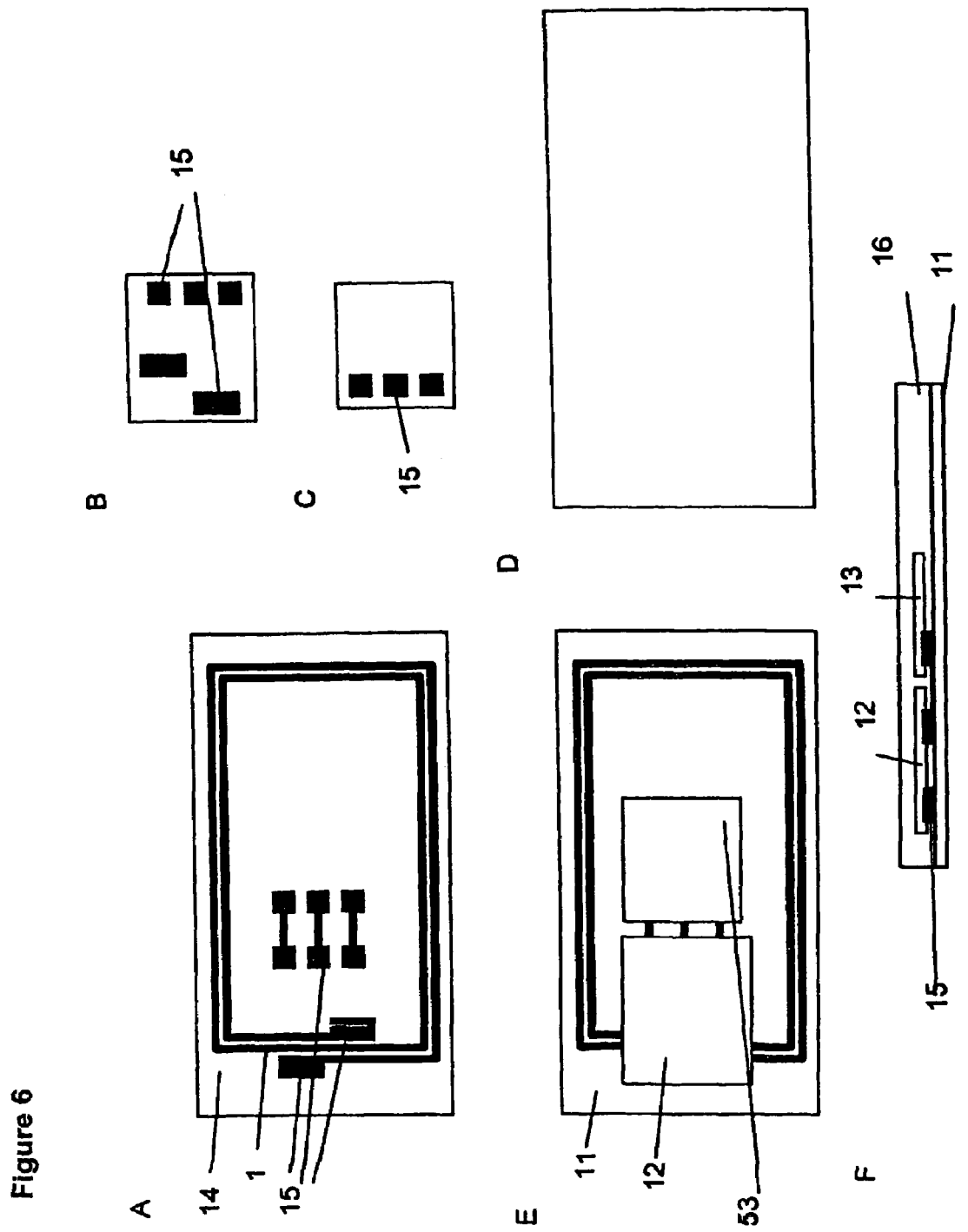
Figure 7:
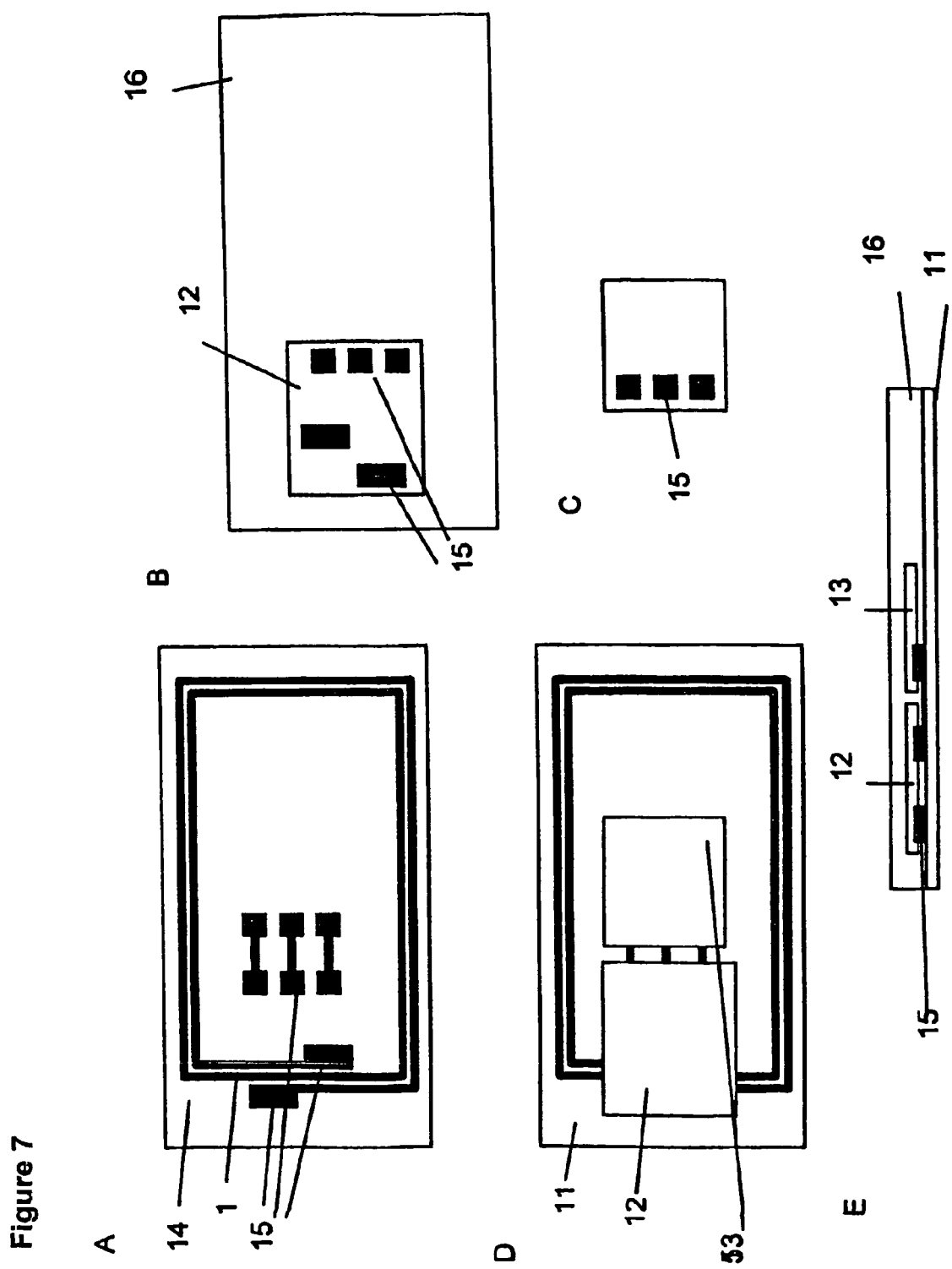

FIGS. 2 through 4 depict schematically different embodiments of the circuit, FIG. 5 depicts the circuit from FIG. 4 divided into three components, and FIGS. 6 and 7 depict options on how to produce the circuit as complete electronic units.

FIG. 1 depicts a state-of-the-art circuit for an RFID tag. Only transistor 4 and the integrated circuit 5 of this circuit are made of organic material. Antenna 1, capacitor 2 and silicon diode 3 consist of inorganic material. Placing OFET 4 after rectifier diode 3 solves the problem of inadequate circuit speed and the OFETs' unfitness for alternating current compared with conventional transistors due to the properties of organic materials to act as charge carrier accumulators and not through the invasion of charge carriers. However, one problem with this embodiment remains, which is that modulation transistor 4 can only switch a small portion of the electrical power, since otherwise the power supply for gate circuit 5 would collapse. Another problem is that diode 3 can utilize only half of the furnished electric power to supply the RFID tag.

Simple switching variations according to the Philips publication, which consequently belong to prior art as well, consist in the integration of transistor 4 into gate circuit 5 or in leaving it out completely, and that the charge change at gate circuit 5 is directly utilized as a modulation signal. An example for this is a ring oscillator, which, as the sole gate circuit, is connected to output side of the rectifier. The oscillation causes periodic changes in power consumption, which can be directly read as charge modulation. Simple electronic watermarks can be produced this way, which oscillate with a predetermined frequency depending on the production of the ring oscillators.

FIG. 2 depicts an example of an embodiment:

One antenna 1 forms a ringing circuit in combination with one capacitor 2, which is adapted to the transmitter frequency of a reading device. An organic diode 3 forms a rectifier in combination with one capacitor 8, which emits a calendered direct current. An organic modulation transistor 4 is connected to the output side of the rectifier. One organic capacitor 7 forms stored energy for a gate circuit 5, and the organic diode 6 prevents said capacitor 7 from discharging via said modulation transistor 4. A gate circuit 8 embodies switching circuits, which read out from a storage and forward the information serially bit by bit to the output side. Said output side is connected with the gate of said modulation transistor 4. The speed of said gate circuit 5 is independent from the transmitter frequency of said reading device.

FIG. 3 depicts a similar embodiment, however, rectifier diode 3 is replaced by one bridge rectifier 3. Said rectifier comprises four integrated organic diodes.

If positive and negative voltage is required for the gate circuit, this can be accomplished by placing two rectifier units in parallel with simple diodes or diode bridge circuits. Another possibility to accomplish this is the installation of a bleeder after a simple rectifier circuit, for example, with resistors connected in series.

FIG. 4 again depicts the embodiment of a circuit, said circuit resembling that in FIGS. 2 and 3, however, all capacitors were replaced by one or two diodes each. Capacitor 2 is operated with alternating current and is therefore replaced by two diodes 2, 2' placed in series with opposite poles. Said capacitors 7 and 8 are supplied with direct current and can therefore each be replaced by one diode (7, 8), which is switched in non-conducting direction. This example of an embodiment can completely do with capacitors, which greatly simplifies production of the circuit.

The problem concerning the low (charge) modulation in the circuit is solved as follows: the gate circuit is supplied by stored energy (e.g. one organic capacitor 7), wherein one organic diode 6 prevents said modulation transistor 4 from draining energy from said storage (see embodiment examples of FIGS. 2 through 4). Said energy storage is charged, when said modulation transistor 4 is blocked. One problem hereby is that the energy storage is discharged, when the bit rate 1 1 1 1 . . . (or 0 0 0 0, depending on the coding of the gate) occurs. This can be prevented, if gate circuit 5 of the RFID tag outputs the information bits in such a way that said modulation transistor 4 is shut off for a very brief period of time in between bits. This can be accomplished by not letting the energy storage fall below a certain charge state irrespective of the bit rate. The main advantage of the energy storage is attributable to the fact that said modulation transistor 4 can switch 100% of the electrical power without the collapse of the power supply to gate circuit 5.

The circuit solves an additional problem, which is the transmission of higher electrical power by utilizing organically integrable diodes, familiar from DE 100 44 842.9. This makes the use of a diode bridge circuit for the purpose of rectifying possible. This allows transmission of double the power, since both half-waves of the alternating current can be used (see embodiment examples of FIGS. 3 and 4). With the approach known from prior art, which is the hybrid use of a silicon diode, such a bridge circuit can practically not be used, since producing RFID tags with hybrid silicon diodes is too time-consuming and too expensive.

A particularly advantageous embodiment of the invention (FIG. 4) is based on the fact that organic diodes in non-conducting direction behave like capacitors. Two diodes placed in series with reversed polarity furnish therefore capacitors that can be operated with alternating current. The advantage of this circuit is the greatly simplified design of polymer RFID tags, since capacitors, that is, several layers of functional polymer and the appertaining process steps, can be dispensed with.

FIG. 5 shows the circuit depicted in FIG. 4 divided into various components 1, 2 and 3.

At first, there is unit 11 having a substrate 14 (flexible film with barrier properties), which is provided with an electrically conductive track 1, functioning as an antenna, and with electrically conductive contacts 15. Then, there is unit 12 containing all components, functioning as diode or capacitor (2, 3, 6, 7 and 8), as well as also electrically conductible contacts 15. Finally, there is unit 13, combining all components 4, 5, which embody an organic transistor, as well as also electrically conductive contacts 15. Hereby, only several of such components must be based on organic materials, for example, an organic chip can also be assembled with inorganic diodes or, antennae may be made of metal or metallic compounds.

FIG. 6 shows how individual units 11, 12 and 13 can be beneficially assembled into one complete system.

Partial FIG. 6A shows unit 11 including antenna and contacts, partial FIGS. 6B and 6C depict a top view of units 12 and 13, in each case. Partial FIG. 6E depicts the assembled electronic unit and 6D shows the encapsulation film lying above. Finally, partial FIG. 6F depicts the cross-section of an electronic unit.

A) Using a suitable method, one antenna (1) as well as electrical contacts (15) are arranged on a substrate film (14) (e.g. through methods such as sputtering, vacuum deposition, galvanic or currentless deposition, printing, micro-punching, photolithography, etching or combinations). This embodies unit 11.

B) Unit 12, embodying, for example, diodes and capacitors as described in FIG. 5, is produced using a suitable method, and electrical contacts 15 are attached. One possibility to build capacitors, for example, is to generate a conductive polymeric region capable of metallization for the capacitor on the side of the substrate, arranged in such a way as to create capacity by means of said region and conductive regions of the transponder antenna after assembling both films.

C) Unit 13, embodying, for example, organic transistors 4 and integrated circuits 5 (produced, for example, by methods such as printing, photolithography, spin coating and the like) is produced using a suitable method, and electrical contacts 15 are attached.

D) Depicts encapsulation film 16, which is said to have barrier properties against environmental influence such as oxygen and/or water vapor like substrate 14, and can be deposited on the other units 11, 12 and 13 using suitable methods such as gluing or laminating.

E) Depicts the arrangement of units 11, 12 and 13 in the assembled state from above. Units 12 and 13 are arranged in such a way that the appropriate electrical contacts 15, in each case, are connected with one another.

F) Depicts the arrangement of E) aside; in addition, the encapsulation film is also drawn in.

The individual components or units 11, 12 and/or 13 are therefore arranged on the substrate or on the encapsulation film and coated with an insulating layer for electrical insulation. The films having been prepared in such a way are then adjusted and assembled into one complete system such as, for example, a transponder.

This can be carried out, for example, through gluing or welding. At the same time, the glue could also correspond to the aforementioned insulating layer or, by adding an additional step in the process, it could also be deposited, for example, through printing, spray coating or crawling. After the adjustment, both films are joined and pressed (autoclave, vacuum press, or the like). In this connection, the application of the glue and/or the pressing process are designed to guarantee that the thickness of the glue on the edges of the two films is minimized, so that there is also a lateral barrier against gases and moisture. At the same time, vias must be able to have electrical contact. Under high temperature and/or ultraviolet light the glue is quenched.

Said assembly principle is also beneficial for many additional products containing polymer electronic components, for example, photovoltaic-sensor assemblies with integrated gating circuits or OLEDs with integrated drive circuits. In this case, for example, the photovoltaic or OLED cells can be deposited on one film and the polymer circuits can be deposited on the other film. Of course, this way it is also possible to combine organic components with conventional, inorganic components.

FIG. 7 describes a different and beneficial way in which such components can be assembled to form a complete system. Again, the figure is subdivided into partial FIGS. 7A through 7E, which show the following:

A) Using a suitable method, one antenna 1 as well as electrical contacts 15 are arranged on a substrate 14 (e.g. through methods such as sputtering, vacuum deposition, galvanic or currentless deposition, printing, micropunching, photolithography, etching or combinations). This embodies unit 11.

B) Unit 12, embodying, for example, diodes and capacitors as described in FIG. 5, is produced using a suitable method, and electrical contacts 15 are attached. Here, unit 12 is arranged directly on the encapsulation film 14, which reduces the overall number of units, thereby eliminating one step in the process.

C) Unit 13, embodying, for example, organic transistors and integrated circuits (produced, for example, by methods such as printing, photolithography, spin coating and the like) is produced using a suitable method, and electrical contacts 15 are attached.

E) Depicts the arrangement of units 11, 12 and 13 in the assembled state from above. Units 12 and 13 are arranged in such a way that the appropriate electrical contacts 15, in each case, are connected with one another.

F) Depicts the arrangement from FIG. 7D aside.

The method to produce electronic units, as depicted in the figures, can be employed not only for the production of RFID tags, rather, there are many more application examples, which embody at least one organic electronic unit and are arranged on a flexible substrate, such as, for example:

(Organic) photovoltaic cells or suitable Sensor Arrays with integrated electronics Active organic displays (OLED or other displays)

Hand-held calculators consisting of several individual components

"Wearable electronics." Electronic units inserted in clothing

Intelligent paper: electronics inserted into paper or paper-like material

Advertising labels with blinking and/or glowing and/or acoustic display.

The invention claimed is:

1. An organic electronic device comprising:
a one piece flexible film substrate; and
at least three groups of electrical components each attached directly to the substrate to thereby form the device:
one group of the components comprising essentially inorganic units;
one group of the components comprising passive units; and
one group of the components comprising active units;
wherein
the group comprising passive units contains no active units or no active components and the group of active units essentially contains organic field-effect transistors, wherein the three groups comprise separate and discrete structures arranged to be assembled independently of one another, and are ohmically interconnected via electrically conductive tracks and contacts forming a circuit, through which the electrically conductive tracks run between passive and active units from one group to another on the substrate.

2. The organic electronic device in accordance with claim 1 wherein at least one of said electrically conductive tracks and contacts comprises an electrically conductive adhesive.

3. The organic device in accordance with claim 1 further including an RFID tag, inside the RFID tag are a sensor array and a photovoltaic cell coupled to the circuit, wherein the tag is arranged in a configuration comprising any one selected from the group consisting of wearable electronics, an active display, an electronic bar code, an electronic watermark, an electronic stamp, a bag tag and an electronic ticket.

4. The organic electronic device in accordance with claim 1 wherein the circuit comprises the following components:
an antenna, a first capacitor, a diode, and a modulation transistor, all of which being electrically coupled to and in front of an integrated circuit, in which a second and a third capacitor and an additional diode are switched in the circuit to supply current to the integrated circuit via the second capacitor, and where, at the same time, the additional diode prevents said modulation transistor from depriving said second capacitor with energy.

5. The organic device of claim 1 including an encapsulation film for encapsulating at least the interconnected groups.

6. A method to produce an organic electronic device comprising forming a circuit including forming and preassembling as separate discrete units in the circuit arranged to be assembled independently of one another at least one group of units with an antenna, a passive group of units and an active group of units, at least a portion of one of the passive groups and active groups comprising organic units, and then assembling the circuit through electrical interconnection of the individual groups of units directly onto a one piece substrate film; including forming a capacitor on a flexible substrate film or encapsulation film, the forming the capacitor step comprising:

forming ohmically conductive regions on the antenna, and forming an ohmically conductive polymeric region on the substrate or encapsulation film for subsequent metallization to create the capacitor comDrisincl said ohmically conductive polymeric region on the substrate or encaDsulation film and ohmically conductive regions on the antenna after assembling the substrate film and active and passive groups.

7. An organic electronic device comprising at least three groups of components:
one group comprising essentially inorganic units,
one group of passive units,
one group of active, units,
wherein
the group comprising passive units contains no active units or no active components and the group of active units essentially contains at least one organic field-effect transistor, wherein the three groups comprise structures arranged to be assembled independently of one another, wherein said units are interconnected via ohmically conductive electrical tracks on a flexible film substrate forming a circuit, in which circuit the electrical tracks run between passive and active units from one group to another;
and wherein the circuit comprises:
an antenna, a first capacitor, a diode, and a modulation transistor, the foregoing being ohmically coupled to and in front of an integrated circuit, in which a second and a third capacitor and an additional diode are switched in the circuit to supply current to the integrated circuit via the second capacitor, and where, at the same time, the additional diode prevents said modulation transistor from depriving said second capacitor with energy.

8. A method to produce an organic electronic device comprising:

forming a circuit including forming and preassembling as separate discrete units in the circuit and arranged to be assembled independently of one another at least one group of units with an antenna, a passive group of units and an active group of units, at least a portion of one of the passive groups and active groups comprising organic units, and then assembling the circuit through electrical interconnection of the individual groups of units directly on a one piece flexible substrate film; and forming a capacitor on the flexible substrate film, the forming the capacitor step comprising:

forming ohmically conductive regions on the antenna, and forming an ohmically conductive polymeric region on the substrate for subsequent metallization to create the capacitor comprising said ohmically conductive polymeric region on the substrate and the ohmically conductive regions on the antenna after assembling the substrate film and active and passive groups.

9. A method of making an organic electronic device comprising:

forming a one piece flexible film substrate; and
forming at least three groups of electrical components each attached directly to the substrate to thereby form the device;
forming one group of the components comprising essentially inorganic Units;
forming one group of the components comprising passive units; and
forming one group of the components comprising active units;
wherein the forming of the group comprising passive units contains no active units or no active components and forming the group of active units essentially contains organic field-effect transistors, wherein the forming the three groups forms the three groups to comprise separate and discrete structures arranged to be assembled independently of one another, and are ohmically interconnected via electrically conductive tracks and contacts forming a circuit, through which the electrically conductive tracks run between passive and active units from one group to another on the substrate.

* * * * *

UNITED STATES PATENT AND TRADEMARK OFFICE
CERTIFICATE OF CORRECTION

PATENT NO. : 7,483,275 B2  Page 1 of 1
APPLICATION NO. : 10/492923
DATED : January 27, 2009
INVENTOR(S) : Wolfgang Clemens et al.

It is certified that error appears in the above-identified patent and that said Letters Patent is hereby corrected as shown below:

Col. 9, line 11, change "comDrisingcI" to read -- comprising --

Col. 9, line 13, change "encaDsulation" to read -- encapsulation --

Signed and Sealed this

Thirty-first Day of March, 2009

JOHN DOLL
*Acting Director of the United States Patent and Trademark Office*